(12) United States Patent
Merlin et al.

(10) Patent No.: US 7,091,582 B2
(45) Date of Patent: Aug. 15, 2006

(54) ELECTRONIC PACKAGE WITH SNAP-ON PERIMETER WALL

(76) Inventors: Mario Merlin, Via San Giovanni 62, San Carlo Canavese, Torino (IT) 10070; Sebastiano Ferrero, Via Tripoli, n. 6, Torino (IT) 10136

( * ) Notice: Subject to any disclaimer, the term of this patent is extended or adjusted under 35 U.S.C. 154(b) by 262 days.

(21) Appl. No.: 10/714,726

(22) Filed: Nov. 17, 2003

(65) Prior Publication Data
US 2004/0099935 A1    May 27, 2004

Related U.S. Application Data

(60) Provisional application No. 60/430,011, filed on Nov. 27, 2002.

(51) Int. Cl.
*H01L 23/02* (2006.01)
(52) U.S. Cl. ............ 257/678; 257/684; 257/99; 257/100; 257/733; 257/687; 257/727; 257/728; 257/731; 257/730; 257/98; 362/255

(58) Field of Classification Search ............... 257/678, 257/684, 99, 100, 733, 727, 728, 731, 730, 257/98; 362/255
See application file for complete search history.

(56) References Cited

U.S. PATENT DOCUMENTS

| | | | | |
|---|---|---|---|---|
| 5,005,069 | A * | 4/1991 | Wasmer et al. ............. | 257/687 |
| 5,838,703 | A * | 11/1998 | Lebby et al. ............ | 372/50.21 |
| 5,886,403 | A * | 3/1999 | Yoshinaga et al. .......... | 257/688 |
| 6,060,776 | A * | 5/2000 | Spitz et al. ................ | 257/706 |
| 6,541,800 | B1 * | 4/2003 | Barnett et al. ............... | 257/98 |
| 6,821,613 | B1 * | 11/2004 | Kagi et al. ............... | 428/292.1 |

* cited by examiner

*Primary Examiner*—Eddie C. Lee
*Assistant Examiner*—Junghwa Im

(57) ABSTRACT

A semiconductor device package comprises a perimeter wall snap fitted to a base having a semiconductor die mounted on the base. A lead is mounted on the opposite side of the die, and the die and a portion of the lead are protected by an encapsulant disposed within the perimeter wall.

15 Claims, 5 Drawing Sheets

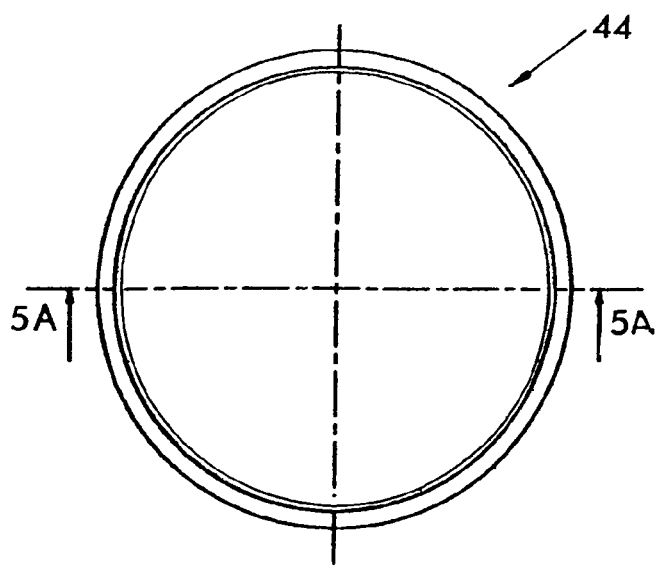
FIG. 5A
FIG 5C
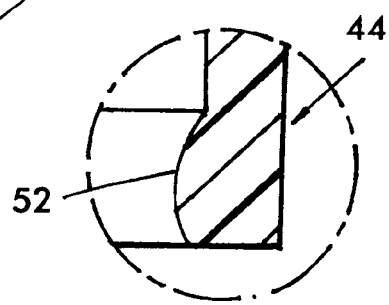
FIG 5B
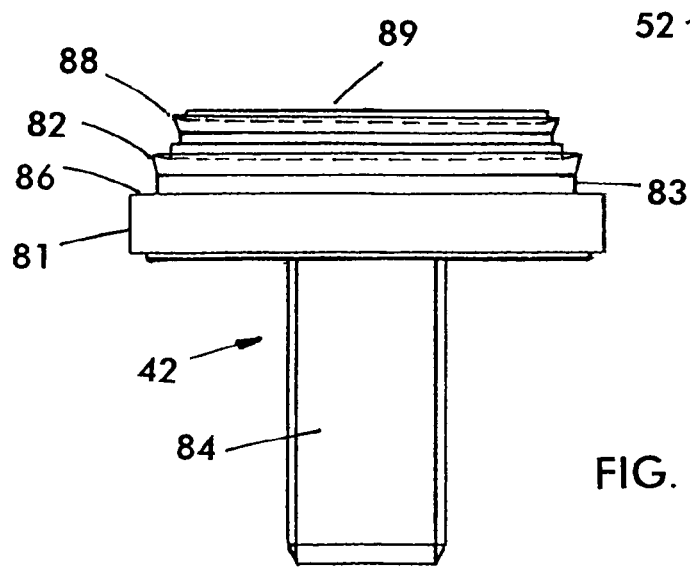
FIG. 8

ELECTRONIC PACKAGE WITH SNAP-ON PERIMETER WALL

RELATED APPLICATION

This application claims the benefit of U.S. Provisional Application No. 60/430,011, filed Nov. 27, 2002, entitled "Package with Snap-on Housing," which is incorporated in its entirety by reference herein.

FIELD OF THE INVENTION

The present invention relates to a semiconductor package and more particularly to a package having an enclosure for protecting a semiconductor die.

BACKGROUND OF THE INVENTION

A well-known semiconductor device package includes a threaded base, a semiconductor die electrically attached to the threaded base, an electric lead connected to the silicon die and projecting in the opposite direction of the threaded base and a housing enclosing a portion of the electric lead, the semiconductor die and the top surface of the threaded base. Such packages are typically used in commercial applicances and low frequency industrial applications, such as welding equipment.

The housings for these packages represent a significant portion of the manufacturing cost and add to the complexity of the manufacturing process. Specifically, in many cases the housing may need to be brazed or soldered to the threaded base. An inexpensive housing concept that adequately protects the semiconductor die, reduces cost, and simplifies the manufacturing process is a long standing and unresolved need.

SUMMARY OF THE INVENTION

One object of the present invention is to provide for an easily assembled semiconductor package having a secure enclosure protecting a semiconductor die.

To achieve this objective, a semiconductor package according to the present invention includes a semiconductor die mounted on a base portion, a perimeter wall snap-fitted on the base portion, surrounding the die, a lead mounted on the die opposite of the base portion and an encapsulant disposed within at least a portion of the space provided between the perimeter and the base portion, encapsulating the die and a portion of the lead. Thus, another portion of the lead is available for connection to an electronic circuit.

Other features and advantages of the present invention will become apparent from the following description of the invention which refers to the accompanying drawings.

BRIEF DESCRIPTION OF THE FIGURES

FIG. 5A shows a cross-sectional view of a second embodiment.

FIG. 5B shows a close-up view of the bottom edge of the perimeter wall of FIG. 5A.

FIG. 5C shows a top plan view of the second embodiment.

FIG. 8 shows an embodiment of the base portion for use with the perimeter wall of FIGS. 5A–5C, showing hidden lines.

DETAILED DESCRIPTION

Figure 1:
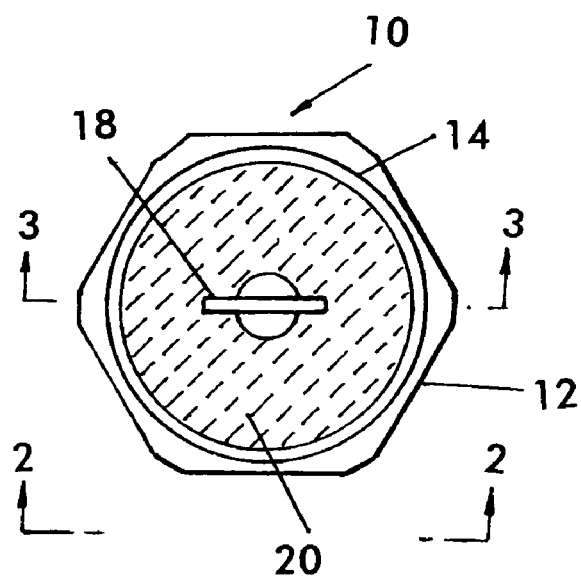
FIG. 1 shows a top plan view of a semiconductor device package according to a first embodiment of the present invention.
Figure 3:
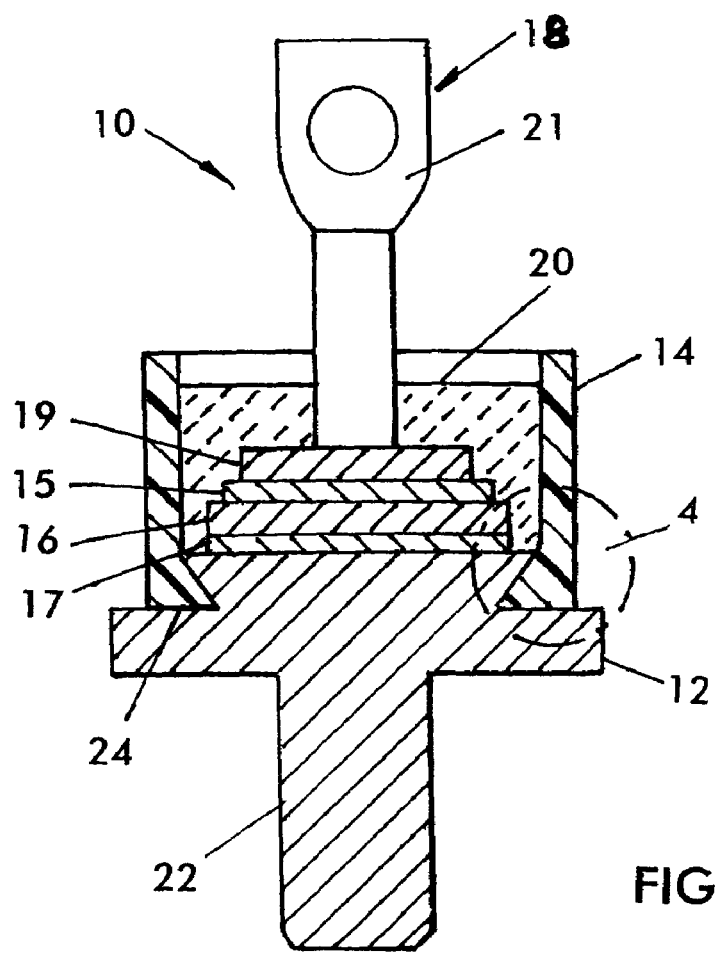
FIG. 3 shows a cross-sectional view of the package shown in FIG. 1 along line 3—3 looking in the direction of the arrows.

Referring to FIG. 1, which shows a first embodiment of the present invention, a semiconductor package 10 includes a base portion 12 and a perimeter wall 14 secured to the base position 12 by a fitting. The base portion 12 may be formed of a copper and plated with nickel, and the perimeter wall 14 may be formed of a composite, such as polyphenylsulfide (PPS) mixed with about 40% glass fiber, for example. As shown in FIG. 3, an electronic device, such as a semiconductor die 16, is disposed on a surface of the base portion 12 within the interior of the perimeter wall 14.

The die 16 is electrically connected to a lead 18 by a first electrode 15 thereof and to the base 12 by a second electrode 17 thereof, as will be described later. Preferably, the perimeter wall 14 is cylindrically-shaped and annular, such as a ring, allowing the lead 18 to extend above the perimeter wall 14 for connection to an electronic circuit. The lead 18 may be any conventional lead, such as wire shaped or any other form. An encapsulant 20 fills at least a portion of the space between the perimeter wall 14 and the base portion 12, encapsulating the die 16 and a portion of the lead 18.

Figure 2:
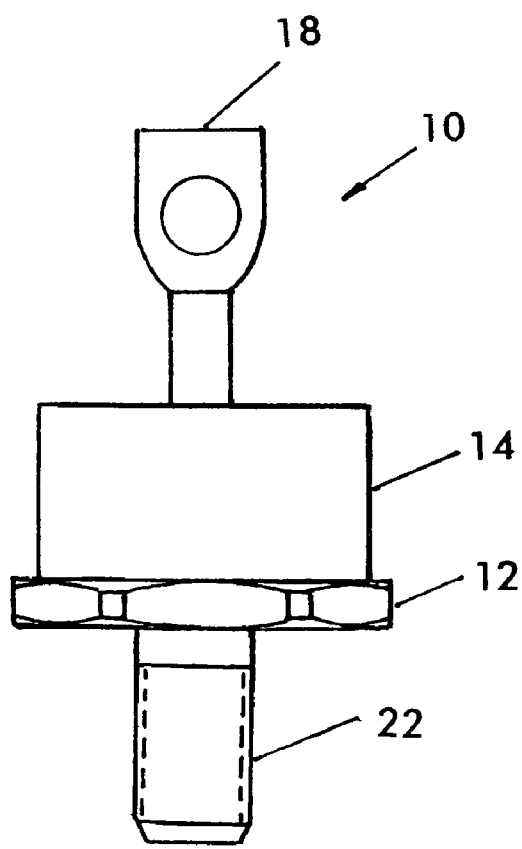
FIG. 2 shows a side plan view of the package shown in FIG. 1 in the direction of arrows 2—2.

The semiconductor device package 10 may include a threaded extension 22, as shown in FIG. 2, which may be integrally formed with the base portion 12 and extends from the bottom surface of the base portion 12, for example, in a direction normal to the bottom surface. In one embodiment, a portion of the outer boundary of the base portion 12 is hexagonal, allowing the package 10 to be tightened by an appropriately-sized conventional wrench such that the threaded extension 22 is screwed into a corresponding threaded socket (not shown). For example, the threaded socket may be fixed and electrically connected in an external electronic circuit.

In one preferred embodiment, threaded extension 22 is comprised of copper or an alloy of copper. Alternatively, the threaded extension 22 may be of iron or an alloy of iron, which may be plated with tin. The threaded extension 22 may be insulated with a silicone sleeve or may be without insulation.

Referring next to FIG. 3, lead 18 includes a lower portion 19. The lower portion 19 is electrically connected to one electrode 15 of the die 16 by any known method. For example, the electrode 15 may be soldered to the lower portion 19 of the lead 18. Another electrode 17 of the die 16 is electrically connected to the base portion 12, by any known method, such as by the same method as the first electrode 15. In one embodiment, a lower portion 19 of the lead 18 is formed of copper or a copper alloy and a stem portion 21 of the lead 18 is formed of iron or an iron alloy. The lower portion 19 and the stem portion 21 are joined, for example, by soldering, such as capacitive discharge soldering using a eutectic material. The eutectic material of one embodiment is comprised of 20% silver and 80% copper by weight, for example.

Figure 4:
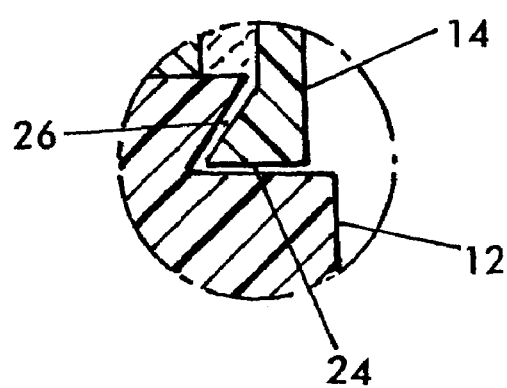
FIG. 4 is an enlarged view of area 4 in FIG. 3.

In one embodiment, the perimeter wall 14 has a lip 24 disposed at one end. In the example of an annular perimeter wall 14, the lip extends inwardly toward the interior of the annulus. Referring to FIG. 4, the lip 24 is capable of being received in a recessed portion of the base portion 12. For example, the recessed portion 26 is a notch positioned below a portion of the base portion 12 that receives the die 16, such that ring 14 is capable of being snap fitted on the base portion 12, encircling the die 16 and securing the perimeter wall 14 to the base portion 12.

For example, the diameters of the annular portion of the perimeter wall 14, the lip 24, the base portion 12 and the recessed portion 26 are dimensioned such that the perimeter wall 14 is tightly coupled to the base portion 12, preventing an encapsulant 20 from escaping the interior of the perimeter wall 14, for example, when the encapsulant 20 is poured in a liquid state into the volume defined by the perimeter wall 14 and the base portion 12. In one embodiment, the encapsulant 20 is a viscous resin and is introduced by vacuum filling. The resin is then cured, encapsulating the die 16 and a portion of the lead 18. During curing, the resin is retained within the ring 14 by the snap fitting between the recessed portion 26 and the lip 24. For example, the encapsulant 20 is an epoxy resin, such as Araldite (e.g. CW 1195-1 BD Black) with a cathalizer (e.g. Hardener HW 1196 BD).

Figure 6:
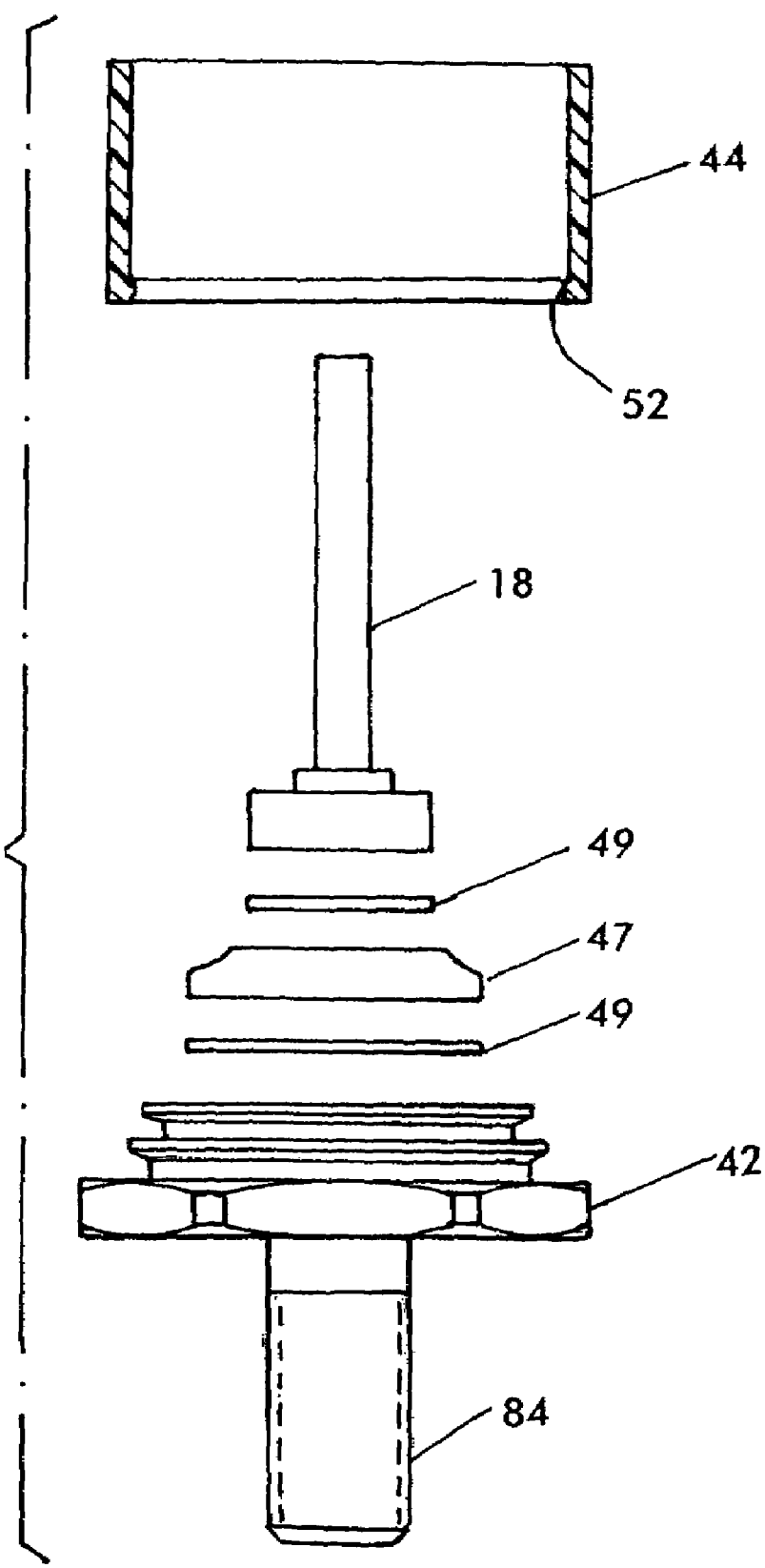
FIG. 6 shows an exploded view of the second embodiment of the present invention.

An exploded view of a second embodiment is shown in FIG. 6. The base portion 42 is comprised of a nickel plated copper, for example. The base comprises an attachment lug 84, which may be threaded. The lug 84 is joined to a base shelf 81, as shown in FIG. 8, which may be shaped for mating with a wrench (not shown) that is used for tightening the base portion 42 in a socket (not shown), as discussed previously in reference to the first embodiment of the present invention.

The base shelf 81 is joined to an intermediate shelf 83. The intermediate shelf 83 has a smaller diameter than the base shelf 81. The upper surface 86 of the base shelf 81 may be joined to a lower surface of the intermediate shelf 83 by soldering, welding or gluing, or the intermediate shelf 83 may be an integral part of the base portion 42. The base portion 42 may be formed as a unit by casting, forging, extruding and machining processes, for example. The intermediate shelf 83 has a first cylindrical extension 82 from its sidewall that defines a recessed portion of the intermediate shelf 83. The bulge 52 in the bottom edge of the annular ring 44 or the inner wall of the ring 44 may create a compression fitting against a portion of the intermediate shelf 83, such as the extension 82, and/or the upper surface 86 of the first shelf 81.

Also, the base portion 12, 42 may be adapted to enhance adhesion of the cured resin to the base portion 12, 42. For example, a retaining structure, such as a shelf 88 having another recessed portion, may be used to retain the encapsulant 20 on the base 12. Also, a projection may be used to prevent the cured resin from rotating with respect to the base. For example, the projection may extend from a portion of the base 12, 42 such as a pin, fin or other projection from the second notch, which locks the encapsulant 20 to the base portion 12. Alternatively, a portion of the retaining structure 88 may be knurled, scored or striated to prevent rotation of the encapsulant 20 on the base portion 12, 42.

Figure 7C:
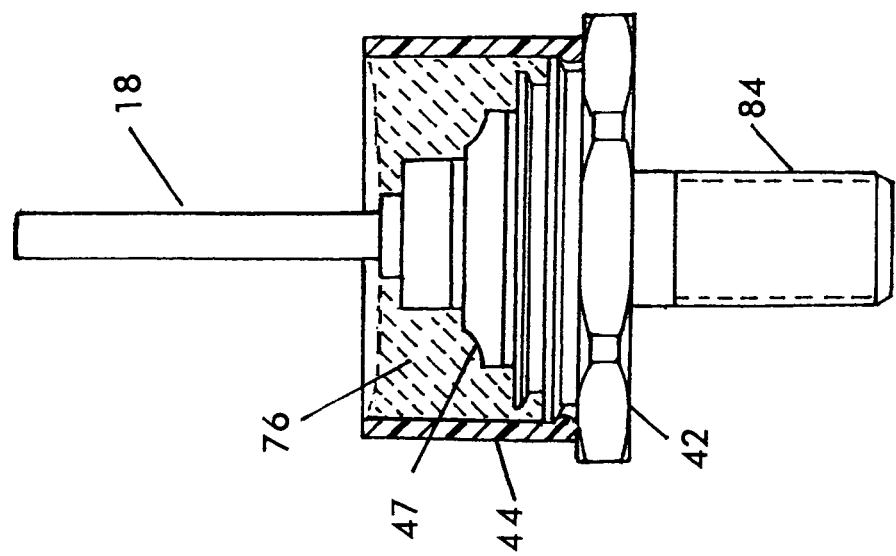
FIGS. 7A–7C illustrate the steps in assembling the embodiment shown in FIG. 6.

The intermediate shelf 83 may be joined to the retaining structure 88 that retains the cured encapsulant 76, fixing the encapsulant 76 to the base portion 42, as shown in FIG. 7C. Alternatively, the retaining structure 88 may be integrally formed with the base portion 42

Figure 7B:
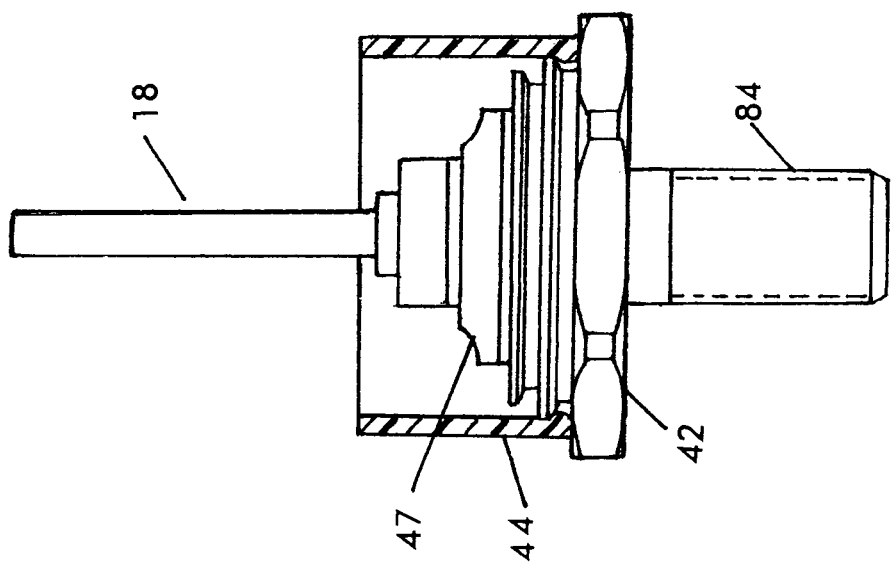

In the second embodiment, such as shown in FIGS. 5A–5C, the perimeter wall 44 comprises an annular wall having a lower portion, such as the bottom edge of the ring, comprising an inwardly extending arcuate surface 52. The arcuate surface 52 creates a bulge, as shown in FIG. 5B, which fits over a cylindrical extension 82 protruding from the side of a base 42, such as shown in FIG. 8. The arcuate surface 52 creates a compression fitting, such as shown in FIG. 7B. For example, the bulge 52 helps the ring 44 to seat directly on the upper surface 86 of the first shelf 81, snap fitting the ring 44, such that liquid resin is capable of being retained within the ring 44.

Figure 7A:
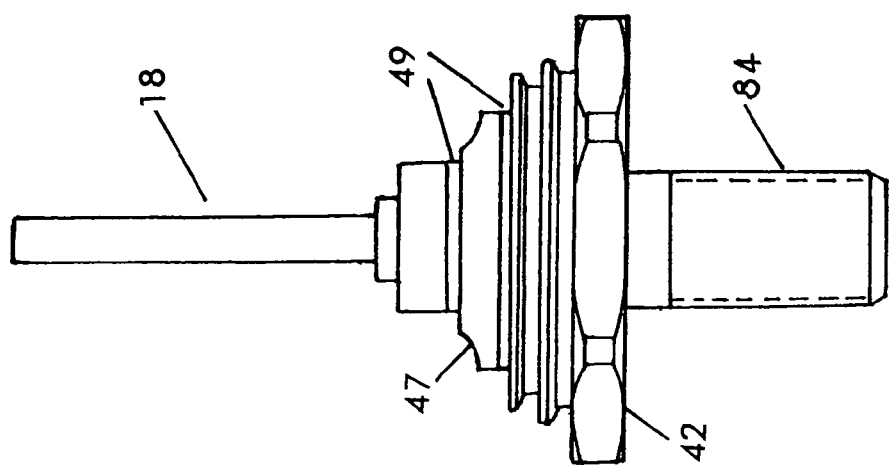

The base portion 42 has a die mounting surface 89 that may be joined to a semiconductor die 47. For example, the die 47 is joined to the die mounting surface 89 by a layer of solder 49, making an electrical connection between the die 47 and the base portion 42, as shown in FIG. 7A. Then, the lead 18 is electrically connected to the die 47, for example, as described previously for another embodiment. In the embodiment shown in FIG. 7A the lead is joined to the surface of the electronic device 47 by a layer of solder 49; however, any method of joining may be used that is capable of making a secure electrical connection.

Next, the ring 44 is snap fitted to the base portion 42, as shown in FIG. 7B, securing the ring 44 (shown in partial cross-section) on the base portion 42. Resin is vacuum filled in the ring 44, and the resin is cured, sealing the electronic device 47 in an encapsulant 76. In FIG. 7C, the ring 44 and the encapsulant 76 are shown in a cut-away, partial cross section, revealing the base portion 42, the die 47 and the lead 18. Thus, the snap-on electronic package is completely assembled, and the die 47 is protected by the encapsulant 76.

A semiconductor device packaged according to the present invention can be adapted to receive any type of die. For example, the die 16, 47 may be a semiconductor chip having any shape with an electrode on each of a top surface and a bottom surface of a thin semiconductor material. The size of the die 16, 47 affects both the size of the package and the rated current. In three examples, the die is a rectifier having dimensions and being capable of handling current as follows:

350×350 mils for a 95 Amp device;

280×280 mils for an 80 Amp device; and

210×210 mils for a 50 Amp device.

Although the present invention has been described in relation to particular embodiments thereof, many other variations and modifications and other uses will become apparent to those skilled in the art. It is preferred, therefore, that the present invention be limited not by the examples herein, but only by the claims themselves.

What is claimed is:

1. A semiconductor device package, comprising a base portion, a semiconductor die electrically mounted on the base portion, a lead electrically coupled to the die, a perimeter wall snap fitted to the base portion and an encapsulant filling at least a portion of the space within the perimeter wall and encapsulating the die and a portion of the lead;

wherein the perimeter wall includes an inwardly extending bulge positioned at a lower portion of the perimeter wall such that the bulge snap fits to the base portion; and wherein the base portion comprises a base shelf having a base sidewall and an intermediate shelf on the base shelf, the intermediate shelf having an intermediate sidewall including a recessed portion, the intermediate shelf being configured such that the bulge of the perimeter wall snap fits onto the recessed portion of the intermediate sidewall.

2. The package of claim 1, wherein the semiconductor die includes a top surface and a bottom surface opposite of the top surface, the top surface comprising a top electrode, the bottom surface comprising a bottom electrode, and the bottom electrode is soldered to the base portion, and the lead is soldered to the top electrode, such that the lead, the die and the base portion are electrically connected.

3. The package of claim 1, wherein the base portion further comprises a retaining structure, the retaining structure being configured such that the retaining structure is surrounded by the perimeter wall without contacting the perimeter wall and is encapsulated, wherein the encapsulant is secured to the base portion.

4. The package of claim 3, wherein the base portion is comprised of a nickel plated copper.

5. The package of claim 4, wherein the base portion further comprises an attachment lug, such that the attachment lug extends from the base portion in a direction away from the lead.

6. The package of claim 5, wherein the attachment lug is threaded.

7. The package of claims 2, wherein the lead comprises a lower portion coupled to the top electrode of the die and a stem portion joined to the lower portion.

8. The package of claim 7, wherein the lower portion of the lead is comprised of copper or a copper alloy.

9. The package of claim 8, wherein the stem portion of the lead is comprised of iron or an iron alloy.

10. The package of claim 9, wherein the lower portion and the stem portion of the lead are joined by capacitance discharge soldering using an eutectic solder.

11. The package of claim 3, wherein the retaining structure is configured such that rotation of the encapsulant in relation to the base portion is prevented.

12. The package of claim 1, wherein the perimeter wall is comprised of a composite material formed into an annular shape.

13. The package of claim 12, wherein the composite material is polyphenylsulfide reinforced by glass fibers.

14. The package of claim 13, wherein the glass fiber comprises about 40% of the composite.

15. A semiconductor device package, comprising:

a base portion comprising an upper surface, a lower surface opposite of the upper surface and a sidewall extending between the upper surface and the lower surface, a portion of the sidewall defining a recessed portion;

a semiconductor die having a bottom surface electrically mounted on the upper surface of the base portion and having a top surface opposite of the bottom surface;

a lead electrically mounted on the top surface of the die such that the lead forms an electrical terminal for the package;

a perimeter wall including a lip extending inwardly from the perimeter wall such that the lip is capable of being snapped into the recessed portion of the base portion, securing the perimeter wall to the base portion; and an encapsulant filling at least a portion of the space within the perimeter wall, encapsulating a portion of the lead and the die;

wherein the base portion further comprises a threaded extension, and the threaded extension extends in a direction normal to the lower surface; and wherein the base portion is comprised of a nickel plated copper, the perimeter wall is comprised of a composite of polyphenylsulfide reinforced by glass fibers, and the lead comprises a lower portion of copper or a copper alloy mounted on the top surface of the die and a stem portion of iron or iron alloy joined to the lower portion by an eutectic solder.

* * * * *